US008950948B2

(12) United States Patent
Gilliland

(10) Patent No.: US 8,950,948 B2
(45) Date of Patent: Feb. 10, 2015

(54) LIGHT PIPE WITH ELECTROMAGNETIC INTERFERENCE SHIELDING

(71) Applicant: International Business Machines Corporation, Armonk, NY (US)

(72) Inventor: Don A. Gilliland, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 227 days.

(21) Appl. No.: 13/717,801

(22) Filed: Dec. 18, 2012

(65) Prior Publication Data

US 2014/0169021 A1 Jun. 19, 2014

(51) Int. Cl.
*G02B 6/40* (2006.01)
*G02B 6/00* (2006.01)

(52) U.S. Cl.
CPC .................................. *G02B 6/00* (2013.01)
USPC .................. 385/88; 385/147; 362/32; 174/35

(58) Field of Classification Search
USPC ........ 385/88–93, 100, 147, 59; 174/35 R, 35; 439/490, 486, 487, 488, 581, 620; 362/26, 327, 337, 551, 555, 334, 335
See application file for complete search history.

(56) References Cited

U.S. PATENT DOCUMENTS

| | | | |
|---|---|---|---|
| 5,548,084 A | 8/1996 | Tracy | |
| 6,249,625 B1 * | 6/2001 | Pan | 385/43 |
| 6,450,832 B1 * | 9/2002 | Aguilar et al. | 439/490 |
| 7,636,245 B2 * | 12/2009 | Clancy et al. | 361/816 |
| 7,972,041 B2 * | 7/2011 | Hung | 362/327 |
| 2011/0176776 A1 | 7/2011 | Imamura | |
| 2012/0230636 A1 | 9/2012 | Blockley et al. | |

FOREIGN PATENT DOCUMENTS

| | | |
|---|---|---|
| CN | 202494819 U | 10/2012 |
| EP | 0428951 B1 | 8/1994 |
| JP | 64057212 U | 3/1989 |
| JP | 2001013359 A | 1/2001 |
| JP | 201113497 A | 1/2011 |
| KR | 100441661 B1 | 8/2005 |

OTHER PUBLICATIONS

"Insturments for measuring light", http://www.fiberdesign.com/, The Netherlands.

* cited by examiner

*Primary Examiner* — Akm Enayet Ullah
(74) *Attorney, Agent, or Firm* — Kevin D. Kehe; Robert R. Williams

(57) ABSTRACT

A light pipe assembly may include a first light pipe having a light pipe column element at an end of the first light pipe. The light pipe column element may have a plurality of light pipe columns. The light pipe assembly may include a second light pipe having a plurality of light pipe column receptacles at an end of the second light pipe. Also, an electrically conductive panel having a light pipe aperture. The light pipe aperture may have a plurality of light pipe channels. The plurality of light pipe columns is adapted to pass through the plurality of light pipe channels and be received by the plurality of light pipe column receptacles.

19 Claims, 7 Drawing Sheets

LIGHT PIPE WITH ELECTROMAGNETIC INTERFERENCE SHIELDING

FIELD

This disclosure generally relates to optical light pipes used for signaling, and more specifically to light pipes passing through electromagnetic interference shielding.

BACKGROUND

In the present competitive electronics marketplace, there are continuing consumer demands for higher frequency electronic devices. Higher frequency electronic components and devices may generate more disruptive electromagnetic interference (EMI) which, if not properly shielded, may interfere with other electronic equipment that makes use of transmitted radio frequency (RF) signals.

EMI emissions typically escape electronic packages through apertures in EMI shields. These apertures may be used for cooling, switches, lights or LED indicators, displays, and jacks for external cable connections. Printed circuit boards used in various types of electronic equipment are typically mounted within a housing structure. During operation of the electronic device, EMI emissions are generated within electronic components, including circuit boards, chips, and other components mounted on the circuit boards. The EMI emissions emanate from these, and must be substantially prevented from escaping outwardly through the housing structure.

It should be noted that EMI emissions generated by electronic components may include electromagnetic energy of wavelengths along various points of the spectrum such as RF interference. As used herein, the term electromagnetic interference (EMI) refers to interfering electromagnetic energy of any wavelength.

SUMMARY

In an embodiment, a light pipe assembly is described. The light pipe assembly may include a first light pipe having a light pipe column element at an end of the first light pipe. The light pipe column element may have a plurality of light pipe columns. The light pipe assembly may include a second light pipe having a plurality of light pipe column receptacles at an end of the second light pipe. Also, an electrically conductive panel having a light pipe aperture. The light pipe aperture may have a plurality of light pipe channels. The plurality of light pipe columns is adapted to pass through the plurality of light pipe channels and be received by the plurality of light pipe column receptacles.

In another embodiment another light pipe assembly is disclosed. The light pipe assembly may have a first light pipe having a light pipe column element at an end of the first light pipe. The light pipe column element has a plurality of light pipe columns. Also, a second light pipe having a plurality of light pipe column receptacles at an end of the second light pipe. The plurality of light pipe column receptacles is adapted to receive the plurality of light pipe columns of the first light pipe.

In yet another embodiment a component aperture is described having a first light pipe having a light pipe column element at a first end of the first light pipe. The light pipe column element has a plurality of light pipe columns. A light source coupled to the first light pipe and adapted to propagate light signals through the first light pipe. A second light pipe having a plurality of light pipe column receptacles at a first end of the second light pipe. Also the component aperture may have an electrically conductive panel having a light pipe aperture. The light pipe aperture may have a plurality of light pipe channels. The plurality of light pipe columns is adapted to pass through the plurality of light pipe channels and be received by the plurality of light pipe column receptacles. The first and second light pipes are adapted to slide through the light pipe aperture. A switch is adapted to engage with a second end of the first light pipe. The switch is adapted to toggle the light source when the first and second light pipes are slid through the light pipe aperture and engage the switch. The component assembly includes an indicator at a second end of the second light pipe to signal propagated light from the light source.

BRIEF DESCRIPTION OF THE DRAWINGS

Embodiments will be better understood from the following detailed description with reference to the drawings, in which.

DETAILED DESCRIPTION

Figure 1:
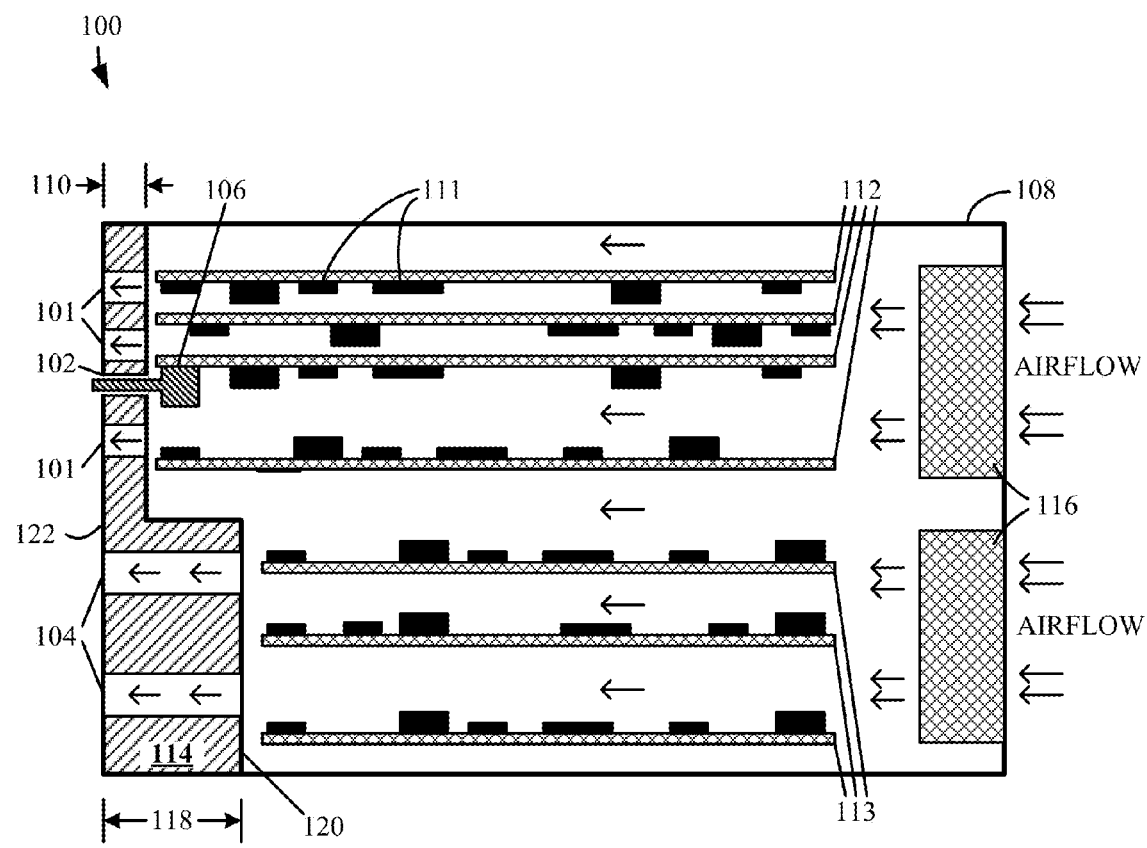
FIG. 1 is a side view of an EMI shield in an electronic system, according to an embodiment.

In general, the embodiments describe a light pipe through an electromagnetic interference (EMI) shield that limits EMI emissions. An electronic system enclosure, according to the embodiments, may provide attenuation for EMI emissions from within the enclosed system, while allowing light pipes to pass through the EMI shield.

Effective EMI shielding and attenuation is becoming increasingly important as electronic devices operate at higher frequencies. Light pipes for fiber optics, visual indicators, or switches may be needed to pass through EMI shielding apertures to satisfy their intended functions. Unfortunately, these light pipe apertures in the EMI shield may adversely affect EMI shielding, as increasing the size and number of apertures in sheet-metal shielding structures has the effect of increasing EMI emissions.

The ever-increasing operating frequencies of electronic components and systems generate EMI that requires smaller area apertures to attenuate, not larger ones. Present light pipe aperture sizes, approximately 4-7 mm in diameter, are too large to contain higher frequency emissions. For example, a signal greater than 3 GHz may easily pass through a 5 mm diameter, circular light pipe aperture with minimal attenuation.

It may be understood that EMI shielding is adversely affected by increasing either the number or the size of apertures for a given EMI emission frequency. It is also understood that EMI shielding is enhanced by increasing the aperture depth. Thus, a deeper aperture (along the axis of the emitted EMI) may be used to compensate for a larger quantity of shielding apertures or larger aperture cross-sectional areas.

Embodiments may employ light pipe apertures having a plurality of light pipe channels of varying cross-sectional areas, shapes, and depths. Larger cross-sectional areas combined with deeper light pipe channels may be used where allowed by components within the system. These light pipe channels may provide greater EMI attenuation, while still allowing light pipe usability. Where components are situated sufficiently close to the EMI shield to prohibit the described apertures, shallower, more numerous, smaller cross-sectional apertures are used, in order to still allow light to propagate, while sufficiently containing EMI emissions. Using multiple small apertures for one light pipe may satisfy constraints for both adequate light propagation and EMI attenuation in physically compact, high operating-frequency enclosures.

The multiple light pipe channels for each light pipe within the EMI shield is an unobstructed passageway through the EMI shield, having a substantially constant cross-sectional area and cross-sectional shape. Cross-sectional shapes may include, but are not limited to: circular, rectangular, square, hexagonal, or any polygonal shape. A polygonal shape is defined as a shape consisting of a series of straight lines with connected endpoints, forming a closed area. The area of any particular cross-sectional shape may be calculated by commonly known formulas, for example:

Area of a circle=πr2

Where: π=3.14 and r=the radius of the circle

Area of a rectangle=lw

Where: l=length and w=the width of the rectangle

Area of a square=s2

Where: s=length of a side of the square

Area of a regular hexagon=1.5dt

Where: d=is the distance between parallel sides, and t is the side length

The light pipe channel cross-sectional shapes illustrated in the FIGs. are only intended to be exemplary; actual shapes used in the practice of embodiments may be any of those listed above, or others. The quantity and arrangement of light pipe channels used in any particular application may vary widely, and may take the form of a regular array or other arrangement of light pipe channels tailored to meet the light propagation and EMI attenuation needs of any particular electronic system enclosure.

Each light pipe channel may have a depth. In some embodiments, the light pipe channel depths may be defined by an electrically conductive panel thickness that the light pipe channel passes through. In other embodiments, the light pipe channel depth may be made greater than an electrically conductive panel thickness by an electrically conductive duct adjacent to an electrically conductive panel, the combination of which forms the EMI shield. In still other embodiments, the light pipe channel is formed at an angle not normal to the electrically conductive panel, and the resulting channel depth may thus be greater than the panel thickness.

The materials used to construct the electrically conductive panel and electrically conductive ducts may include a variety of metals, conductive plastics, plastics with a conductive coating affixed to one or more surfaces, or other electrically conductive materials. Useful metals for fabrication of EMI shields may include aluminum, zinc-plated steel, magnesium, stainless steel and others. Methods of manufacture of metallic EMI shields may include die casting, extrusion, milling, drilling, lamination, or others.

FIG. 1 is a side view of an EMI shield 114 in an electronic system 100, having EMI producing electronic components 111, cooling fans 116, and an electronic system enclosure 108 according to embodiments. The electronic system enclosure 108 may typically be a metal or electrically conductive case, with the conductive surface connected to a grounding structure. The electronic components 111 may be physically and electrically connected to circuit boards 112, 113, which may be in turn physically mounted within the electronic system enclosure 108. Cooling fans 116 may be mounted inside the electronic system enclosure 108, and serve to actively draw cooling air into the electronic system enclosure 108. The cooling fans 116 may provide a positive air pressure within the electronic system enclosure 108. The cooling air may be propelled by the cooling fans 116 across the circuit boards 112, 113 towards the EMI shield 114, which may provide a route for the air to exit the electronic system enclosure 108 through air ventilation channels 101 and 104. The EMI shield 114 may have both an upstream airflow side 120, facing the interior of the electronic system enclosure 108, and a downstream airflow side 122, facing the exterior of the electronic system enclosure 108.

The EMI shield 114 may have two EMI shield thicknesses 110, 118, and two different sizes of air ventilation channels 101, 104, respectively. The EMI shield 114 may be designed to accommodate the varying length of the circuit boards 112, 113, providing adequate clearance between the circuit boards 112, 113 and the EMI shield 114. The size, number, and arrangement of the air ventilation channels 101, 104 as well as the EMI shield thicknesses 110, 118 are designed to meet both the cooling and EMI shielding needs of the electronic system enclosure 108 and electronic components 111 and circuit boards 112, 113.

The EMI shield 114 is also designed to accommodate the protrusion of component 106 through the EMI shield 114. The component 106 may be any component within the electronic system enclosure 108 that requires exposure to the exterior of the electronic system enclosure 108. Examples may include, are not limited to many types of switches, lights or LED indicators, displays, and jacks for external cable connections. Any of these components may include light pipes for signaling light between the interior and exterior of the electronic system enclosure 108.

Figure 2:
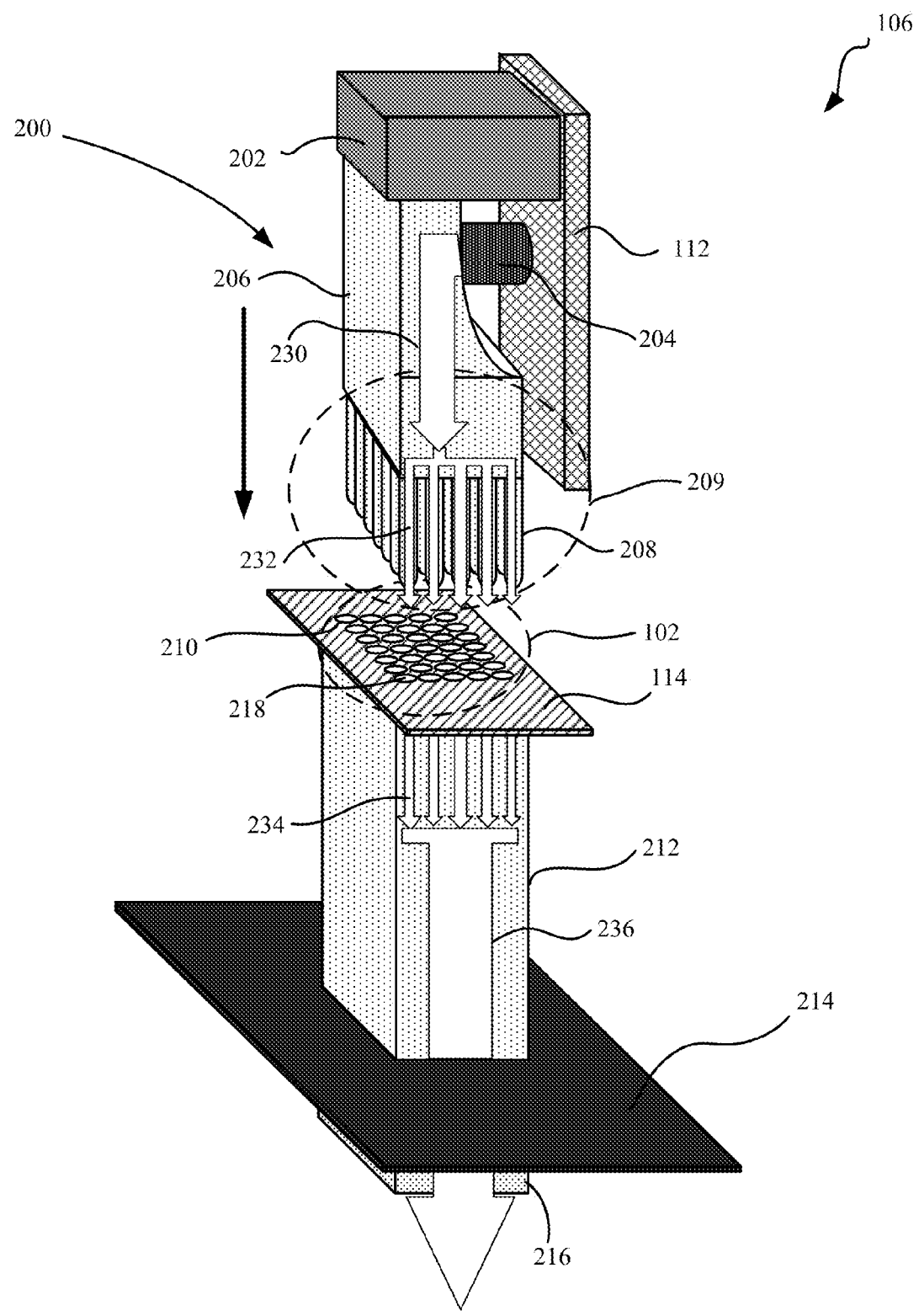
FIG. 2 is an isometric view of an exemplary light pipe through an EMI shield, according to an embodiment.

Referring to FIG. 2, according to an embodiment, a component 106 (FIG. 1) that passes through the EMI shield 114 of FIG. 1 is illustrated. The component 106 may have a light pipe assembly 200. The light pipe assembly 200 may include a first light pipe 206 and a second light pipe 212. The first light pipe 206 may include a plurality of light pipe columns 208. The second light pipe 212 may include a plurality of light pipe column receptacles 218 configured to receive light pipe columns 208. The light pipe assembly 200 may pass through a plurality of light pipe channels 210 making up the component aperture 102 of the EMI shield 114.

In the example given in FIG. 2, the component 106 may be an LED switch that incorporates a light pipe assembly 200. The LED switch may be an indicator with an LED illuminating the light pipe. The LED switch may include the first light pipe 206 and the second light pipes 212. Attached to the end of the second light pipe 212, opposite to the EMI shield 114, may be a push button 214. The second light pipe 212 may be referred to as an indicator 216, adapted to signal the light from the light pipe assembly 200. The first light pipe 206 may have a light source 204 such as an LED that may emit signals through the first light pipe 206 as illustrated by arrow 230 and through the light pipe columns 208 as illustrated by arrows 232. The light from the light pipe columns 208 may enter the light pipe column receptacles 218 as illustrated by arrows 234. The light from the light pipe column receptacles 218 may then illuminate the second light pipe 212 as illustrated by arrow 236 and illuminate the indicator 216.

The light pipe assembly 200 may be adapted to toggle a switch 202 that may turn on and off the light source 204 and the switch may send signals to other circuits on the circuit board 112 and the electronic system 100. The light pipe assembly may be adapted to slide through the component aperture 102. The light source 204 may include more than one LED. Each LED may include different colors to indicate through the light pipe assembly 200 to the indicator 216 the state of the switch 202 or other circuitry in the electronic system 100. In other examples, the light pipe assembly 200 may be used for fiber optics, other indicators, or other components that may be used to signal light into or out of the electronic system 100 through an EMI shield 114.

Figure 3:
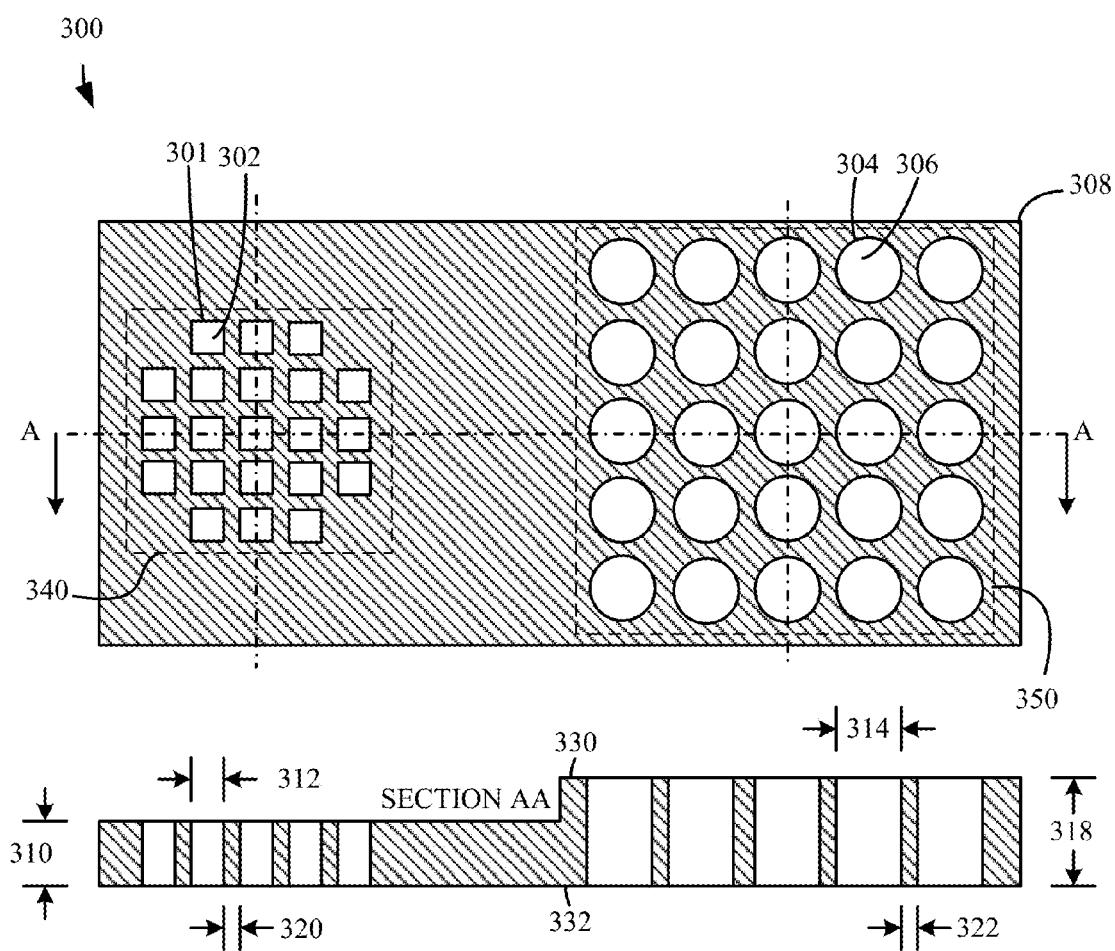
FIG. 3 is a top and front view of two light pipe apertures, each having uniform cross-sectional shapes and channel spacing, according to an embodiment.

FIG. 3, according to an embodiment, includes a top view and a front view along the A-A plane of an exemplary EMI shield 300 having exemplary multiple light pipe apertures 340, 350. The light pipe apertures 340, 350 may each include a matrix of light pipe channels 302, 306, separated by light pipe channel spacing 320, 322. The light pipe apertures 340, 350 may have different shapes. Light pipe aperture 340 may be octagonal while light pipe aperture 350 may be a square. The light pipe channels 302, 306 may be regularly or irregularly spaced in any arrangement. The EMI shield 300 may be formed from an electrically conductive panel 308, which may have an interior side 330 and an exterior side 332. Light may be directed through the electrically conductive panel 308 by the light pipe channels 302, 306 from the interior side 330 towards the exterior side 332 or vice versa through light pipe columns 208 (FIG. 2).

Light pipe channel 302 may have a cross-sectional shape 301, illustrated as a square, having a light pipe channel width 312. The depth of light pipe channel 302 may be equivalent to the EMI shield thickness 310. Light pipe channel 306 may have a cross-sectional shape 304, illustrated as a circle, with a light pipe channel diameter 314. The depth of light pipe channel 306 may be equivalent to the EMI shield thickness 318. The light pipe channel widths 312 and light pipe channel diameters 314 may be adjusted according to the frequency of the EMI emissions that are to be attenuated in the system. For example, a 6 mm aperture may be required for the component 106; however, the 6 mm aperture may be too large to attenuate for a 3 GHz EMI emission. Having multiple light channels of less than 3 mm diameter or width, for example, may provide adequate EMI emission shielding. A designer may specify light pipe widths, diameters, depths, shapes, and arrangements to most effectively provide attenuation for a given emission frequency.

The light pipe channels 302, 306 also may act as apertures to attenuate EMI emissions from electronic components and assemblies. The magnitude of EMI attenuation may depend on several interrelated factors, as previously discussed. The profiles illustrated in FIG. 3 may vary in thickness along one axis. Varying profile thickness along two axes may be another way of practicing the embodiments, though not illustrated herein.

Figure 4:
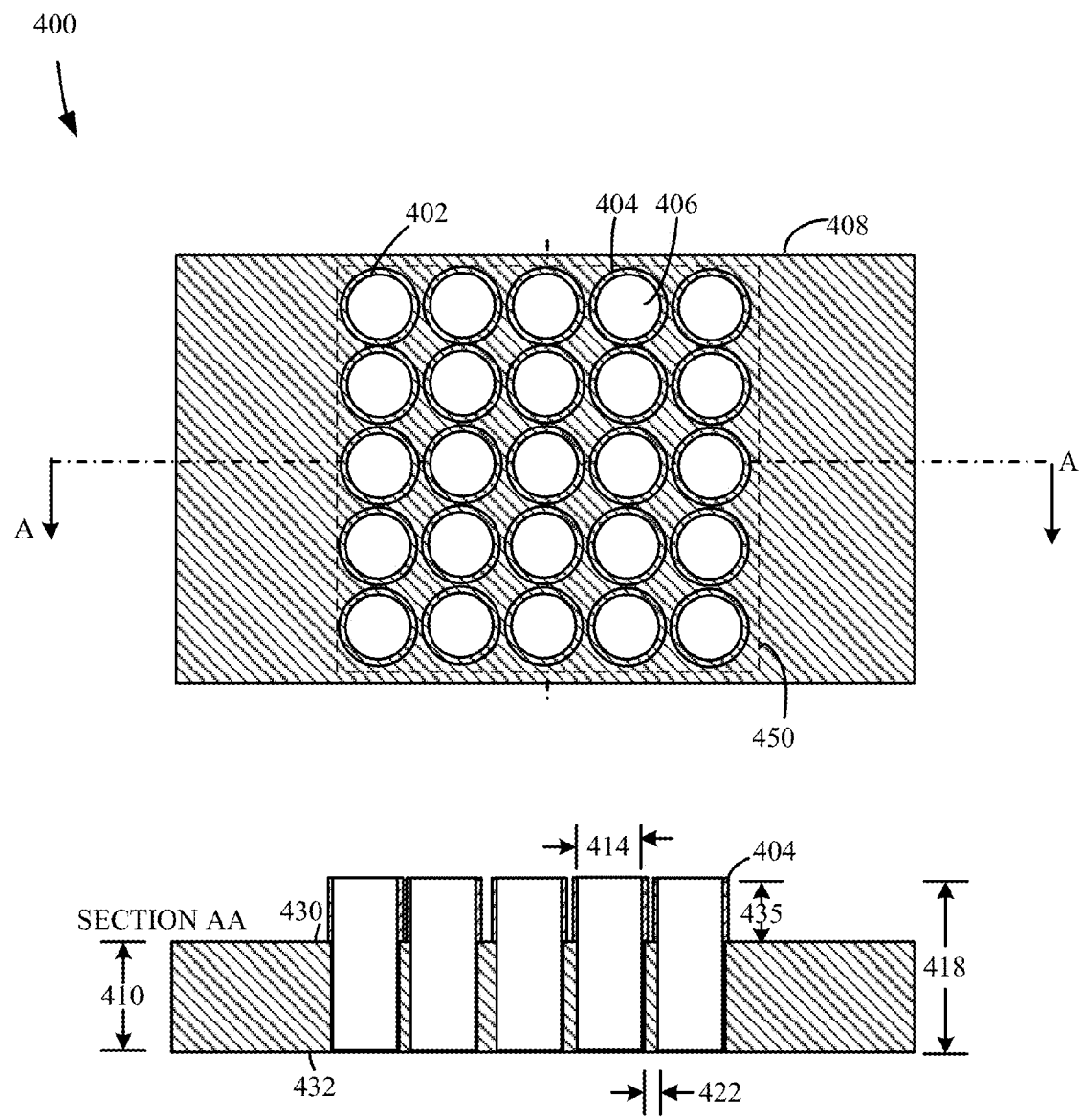
FIG. 4 is a top and front view of an EMI shield having light pipe channels including an electrically conductive duct, according to an embodiment.

FIG. 4 is a top view and front view along the plane A-A of an EMI shield 400 having a conductive panel thickness 410 and a light pipe aperture 450 including a plurality of light pipe channels 406. The light pipe channels 406 may include an electrically conductive duct 404, according to embodiments. The EMI shield 400 may include an electrically conductive panel 408, which may have an interior side 430 and an exterior side 432. Light may be directed from the interior side 430 towards the exterior side 432 or vice versa through the light pipe channels 406 of the electrically conductive panel 408 by light pipe columns 208 (FIG. 2). The electrically conductive ducts 404 may either be attached to the interior side 430, the exterior side 432, or both.

Light pipe channel 406 may have a cross-sectional shape 402, illustrated as a circle, with a light pipe channel diameter 414. The light pipe channel diameter 414 may be consistent throughout the conductive panel 408 and an adjacent electrically conductive duct 404. The light pipe channel depth 418 of light pipe channel 406 may be equivalent to the EMI shield thickness 410 plus an electrically conductive duct height 435. The light pipe channels may be separated from each other by a thickness 422.

The electrically conductive duct 404 may serve to elongate the light pipe channel 406, and provide increased EMI shielding, while adding relatively little additional light attenuation. The electrically conductive duct 404 may be fabricated from any conductive material described above, and may be electrically connected to the conductive panel 408, which is in turn electrically coupled to a grounding structure. The sidewall of the electrically conductive duct 404 may be of any designer chosen and manufacturable thickness. It may be contemplated that a plurality of light pipe channels 406 having a plurality of unique cross-sectional areas, depths, angles, and arrangements may include electrically conductive ducts 404.

The electrically conductive duct 404 and others contemplated may be formed using a pierce and extrude process. The pierce and extrude process may allow electrically conductive ducts 404 to be formed in the conductive panel 408, which may be a low-cost, single thickness, sheet metal plate. In other embodiments, the electrically conductive duct 404 may be an eclectically conductive collar around the light pipe channels 406.

The light pipe channels 406 also act to attenuate EMI emissions from electronic components and assemblies. The magnitude of EMI attenuation depends on several interrelated factors, as previously discussed.

Figure 5:
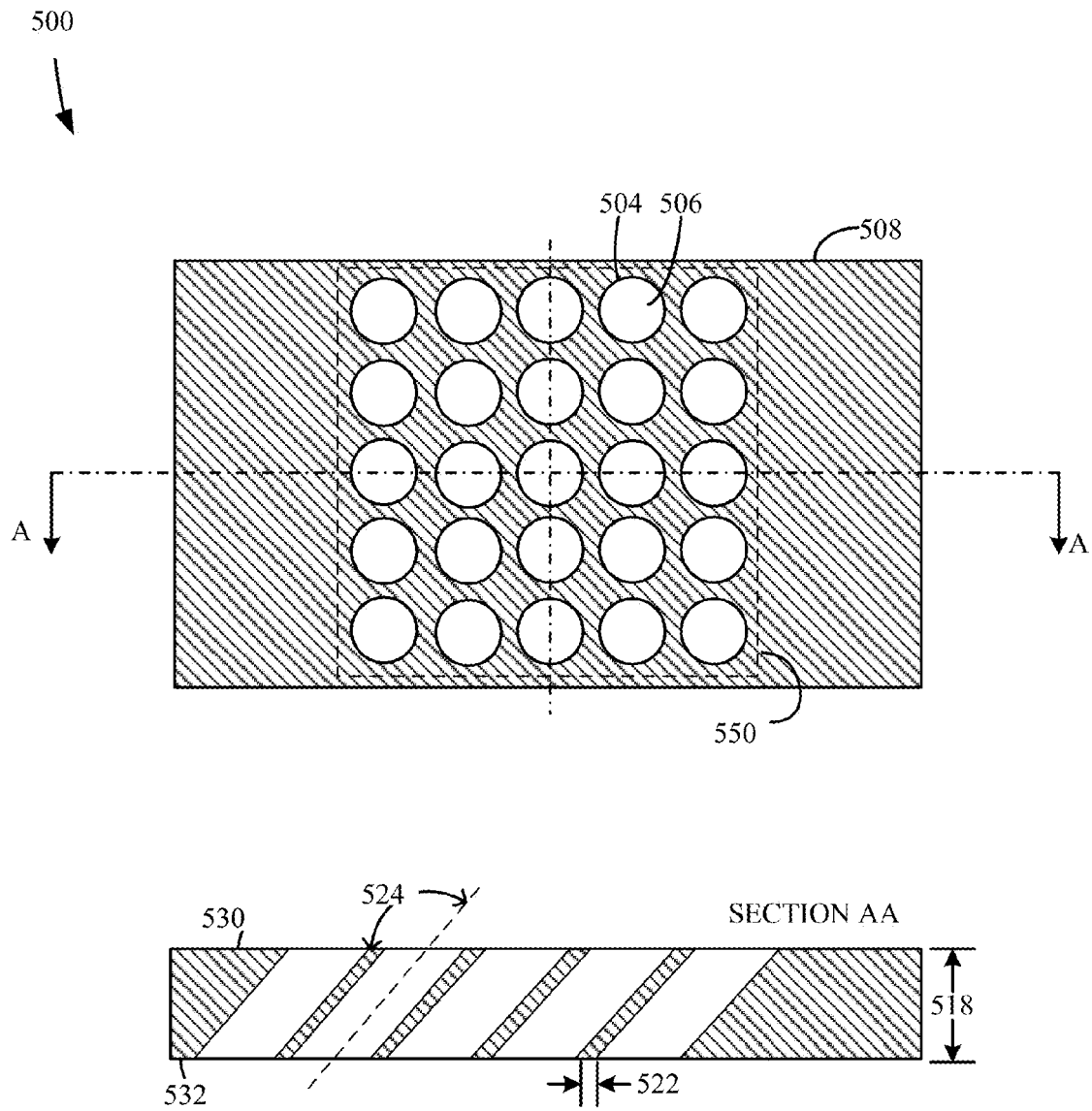
FIG. 5 is a top and front view of an EMI shield having light pipe channels angled relative to the normal, according to an embodiment.

FIG. 5 is a top view and front view along the plane A-A of an EMI shield 500 having an EMI shield thickness 518, a light pipe aperture 550 and a plurality of light pipe channels 506 according to an embodiment. FIG. 5 depicts an EMI shield 500 where the light pipe channels 506 are formed at an angle different than normal to an electrically conductive panel 508. Light pipe channel angles 524 may be used to illustrate this feature. Light may be directed from the interior side 530 towards the exterior side 532 or vice versa through the light pipe channels 506 of the electrically conductive panel 508 by light pipe columns 208 (FIG. 2).

The deviation of light pipe channel angles 524 from normal may be expected to be greater than the angular tolerance for creating light pipe channels 302, 306 (FIG. 3). The deviation of light pipe channel angles from normal may be determined by the designer to reduce EMI emissions. Limits for deviation of light pipe channel angles 524 from normal may be influenced by the manufacturing process used to create the light pipe channels 506.

The light pipe channels 506 may also act to attenuate EMI emissions from electronic components and assemblies. The light pipe channels 506 having an angle significantly different than normal to the electrically conductive panel 508 may offer the benefit of increased EMI attenuation while not significantly increasing light attenuation due to refraction, reflection, or other effects. Any possible improvement in EMI attenuation characteristics depends on many factors, including but not limited to EMI frequency spectrum, angle of the light pipe channels 506 relative to the radiated emissions, cross-sectional area and depth of the light pipe channels 506. Any angular deviation from normal has the inherent effect of elongating the light pipe channels 506, so some increase in EMI attenuation should be expected, per above discussion. The light pipe assembly 200 (FIG. 2) may be adapted to this angled design in the EMI shield 500 to allow connection of the first and second light pipes 206, 212 at the light pipe columns 208 through the EMI shield 500.

Figure 6:
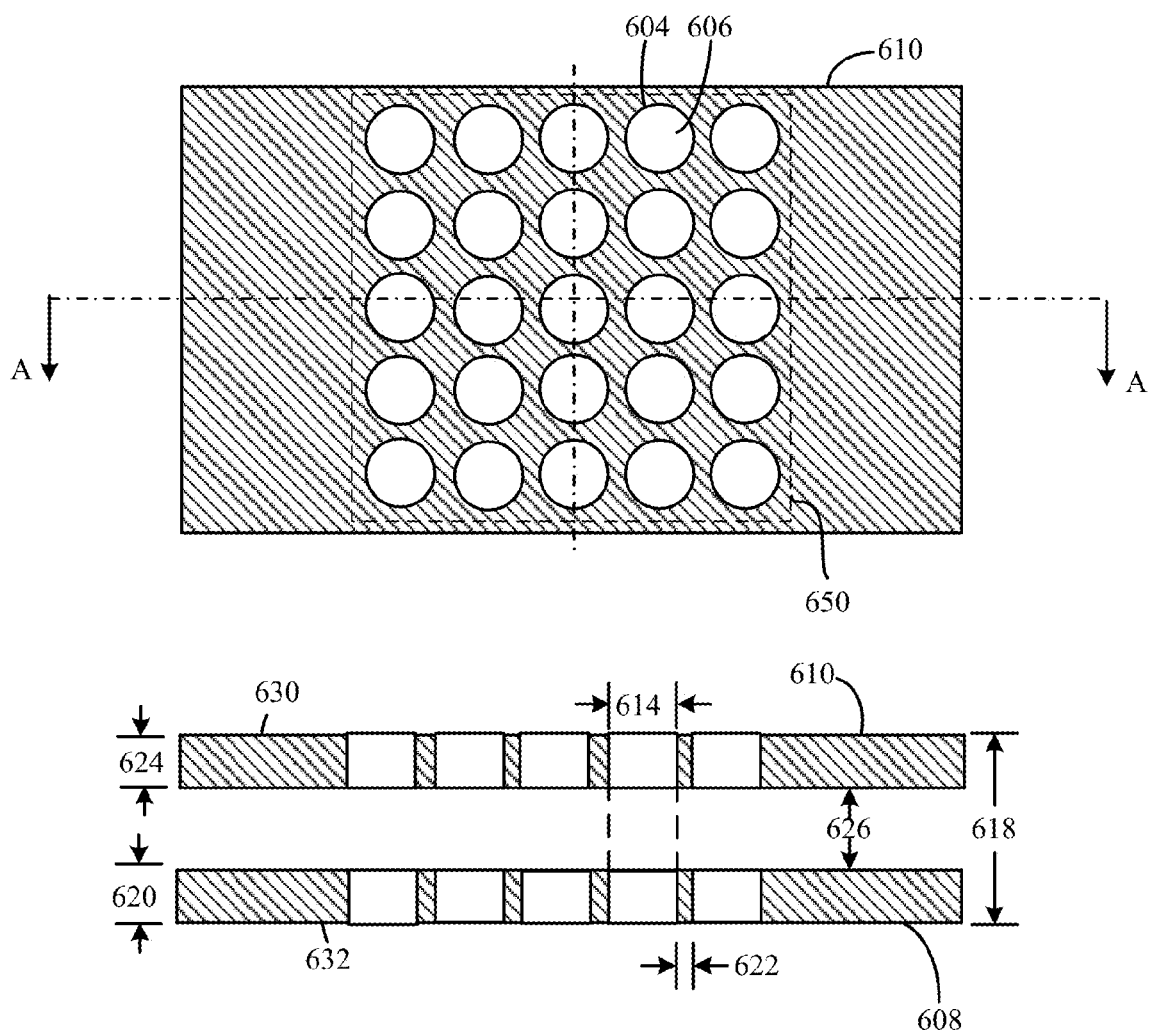
FIG. 6 is a top and front view of a multiple EMI shield having light pipe channels, according to an embodiment.

FIG. 6 is a top view and front view along the plane A-A of an EMI shield 600 having an EMI shield thickness 618, a light pipe aperture 650, and a plurality of light pipe channels 606. The EMI shield 600 may include a plurality of electrically conductive panels 608, 610, which may have an interior side 630 and an exterior side 632. Each electrically conductive panel 608, 610 may have a thickness 620 and thickness 624, respectively. The electrically conductive panels 608, 610 may also be separated by a gap 626. Light may be directed from the interior side 630 towards the exterior side 632 or vice versa through the light pipe channels 606 of the electrically conductive panels 608, 610 by light pipe columns 208 (FIG. 2). Light pipe channel 606 may have a cross-sectional shape 602 illustrated as a circle, with a light pipe channel diameter 614. The light pipe channel diameter 614 may be consistent throughout the conductive panels 608, 610. Light pipe channels 606 may be spaced apart on the EMI shield 600 from each other by a thickness 622.

The plurality of electrically conductive panels 608, 610 may serve to elongate the light pipe channels 606, and provide increased EMI shielding, while adding relatively little additional light attenuation. The plurality of electrically conductive panels 608, 610 may be fabricated from any conductive material described above, and may be electrically coupled to each other, and in turn electrically connected to a grounding structure. It may be contemplated that a plurality of light pipe channels 606 having a plurality of unique cross-sectional areas, depths, angles, and arrangements may include electrically conductive panels 608, 610. The electrically conductive panels 608, 610 and others contemplated may be formed using a pierce and extrude process. The pierce and extrude process allows electrically conductive ducts 404 (FIG. 4) to be formed in the electrically conductive panels 608, 610, which may be a low-cost, single thickness, sheet metal plate. The light pipe channels 606 may also act to attenuate EMI emissions from electronic components and assemblies. The magnitude of EMI attenuation may depend on several interrelated factors, as previously discussed.

Figure 7:
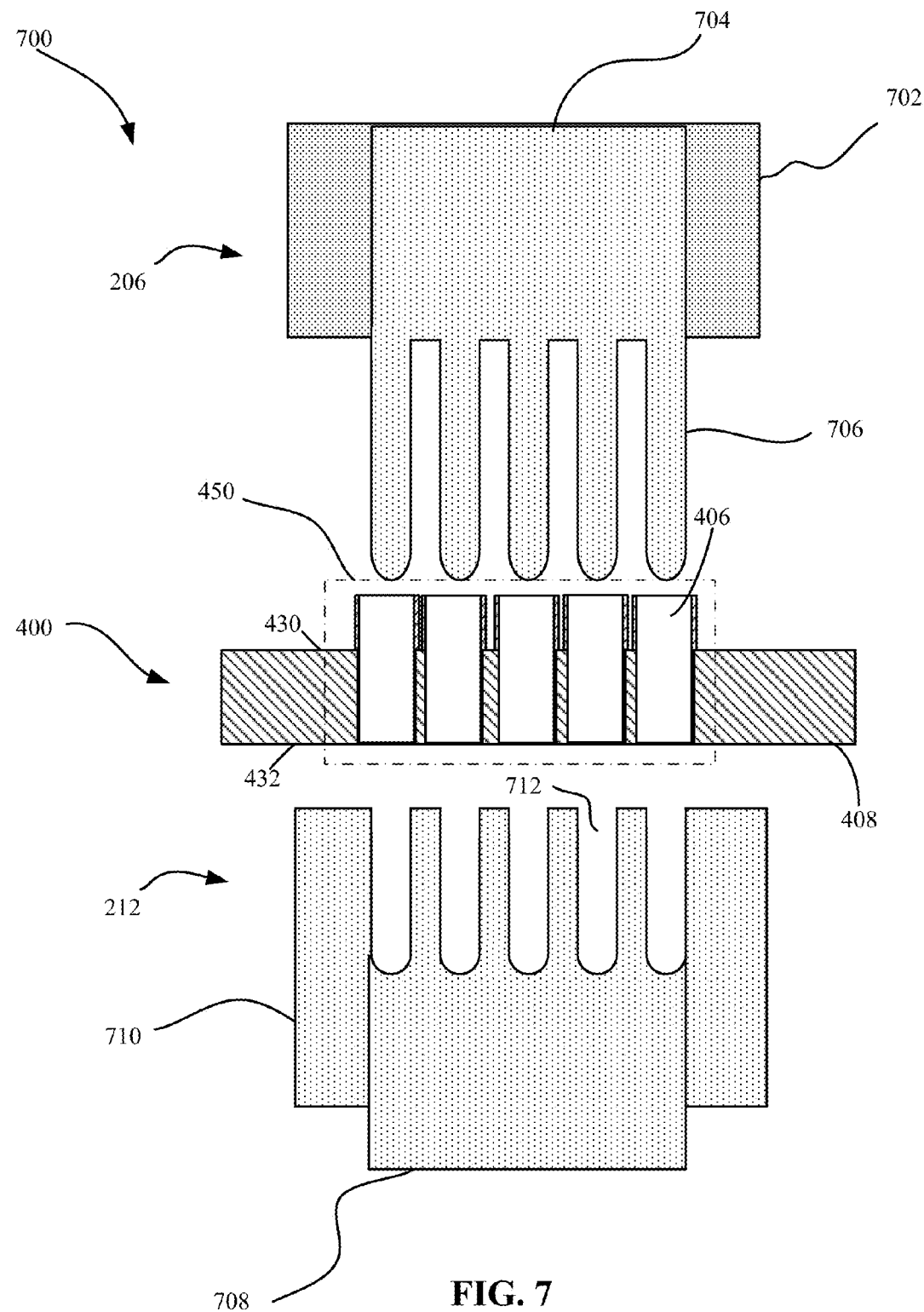
FIG. 7 is a front view of an EMI shield of FIG. 4 with an exemplary light pipe assembly, according to an embodiment.

FIG. 7 is a front view of a light pipe assembly 700, according to an embodiment. The light pipe assembly 700 may include the first light pipe 206, the second light pipe 212 (FIG. 2), and the EMI shield 400 (FIG. 4), however other EMI shields described herein may be used. The first light pipe 206 may have a pipe 704 with a plurality of light pipe columns 706 protruding from one end of the pipe 704. The light pipe 206 may also include a cover 702. The light pipe columns 706 may be adapted to pass through the light pipe channels 406 of the light pipe aperture 450 of the EMI shield 400. The first light pipe 206 may be on the interior side 430 of the electrically conductive panel 408. In other embodiments it may be on the exterior side 432 of the electrically conductive panel 408. The light pipe columns 706 may be longer than the length of the light pipe channels 406 as to couple with the second light pipe 212. The second light pipe 212 may have a pipe 708 and a plurality of light pipe column receptacles 712. The second light pipe 212 may also have a cover 710. The light pipe column receptacles 712 may be adapted to receive the light pipe columns 706 after the light pipe columns 706 pass through the EMI shield 400 through the light pipe channels 406. The light pipe columns 706 and the light pipe column receptacles 712 may adapted to the characteristics of the light pipe columns 406, such as, but not limited to, length, diameter, angle, shape, and spacing.

While the disclosure has been described with reference to specific embodiments thereof, those skilled in the art will be able to make various modifications to the described embodiments without departing from the true spirit and scope of the embodiments. The terms and descriptions used herein are set forth by way of illustration only and are not meant as limitations. Those skilled in the art will recognize that these and other variations are possible within the spirit and scope of the embodiments as defined in the following claims and their equivalents.

What is claimed is:

1. A light pipe assembly comprising:
a first light pipe having a light pipe column element at an end of the first light pipe, the light pipe column element having a plurality of light pipe columns;
a second light pipe having a plurality of light pipe column receptacles at an end of the second light pipe; and
an electrically conductive panel having a light pipe aperture, the light pipe aperture having a plurality of light pipe channels, wherein the plurality of light pipe columns is adapted to pass through the plurality of light pipe channels and be received by the plurality of light pipe column receptacles.

2. The light pipe assembly of claim 1, wherein the electrically conductive panel is an electromagnetic interference (EMI) shield.

3. The light pipe assembly of claim 1, wherein there is a plurality of electrically conductive panels each having a light pipe aperture, the light pipe apertures having a plurality of light pipe channels.

4. The light pipe assembly of claim 1, wherein the light pipe channels are formed at an angle in the electrically conductive panel that is not normal to the electrically conductive panel.

5. The light pipe assembly of claim 4, wherein the light pipe columns of the first light pipe are formed at the angle of the light pipe channels and the light pipe column receptacles are formed at the angle of the light pipe channels to receive the light pipe columns.

6. The light pipe assembly of claim 1, wherein the light pipe channels include an electrically conductive duct coupled to the electrically conductive panel.

7. A component comprising:
a first light pipe having a light pipe column element at a first end of the first light pipe, the light pipe column element having a plurality of light pipe columns;
a light source coupled to the first light pipe adapted to propagate light signals through the first light pipe;
a second light pipe having a plurality of light pipe column receptacles at a first end of the second light pipe;
an electrically conductive panel having a light pipe aperture, the light pipe aperture having a plurality of light pipe channels, wherein the plurality of light pipe columns is adapted to pass through the plurality of light pipe channels and be received by the plurality of light pipe column receptacles and the first and second light pipes are adapted to slide through the light pipe aperture;
a switch adapted to engage with a second end of the first light pipe, the switch adapted to toggle the light source when the first and second light pipes are slid through the light pipe aperture and engage the switch; and an indicator at a second end of the second light pipe to signal propagated light from the light source.

8. The light pipe assembly of claim 7, wherein the electrically conductive panel is an electromagnetic interference (EMI) shield.

9. The light pipe assembly of claim 7, wherein there is a plurality of electrically conductive panels each having a light pipe aperture, the light pipe apertures having a plurality of light pipe channels.

10. The light pipe assembly of claim 7, wherein the light pipe channels are formed at an angle in the electrically conductive panel that is not normal to the electrically conductive panel.

11. The light pipe assembly of claim 10, wherein the light pipe columns of the first light pipe are formed at the angle of the light pipe channels and the light pipe column receptacles are formed at the angle of the light pipe channels to receive the light pipe columns.

12. The light pipe assembly of claim 7, wherein the light pipe channels include an electrically conductive duct coupled to the electrically conductive panel.

13. A light pipe assembly comprising:
a first light pipe having a light pipe column element at an end of the first light pipe, the light pipe column element having a plurality of light pipe columns; and
a second light pipe having a plurality of light pipe column receptacles at an end of the second light pipe, wherein the plurality of light pipe column receptacles is adapted to receive the plurality of light pipe columns of the first light pipe.

14. The light pipe assembly of claim 13, further comprising:
an electrically conductive panel having a light pipe aperture, the light pipe aperture having a plurality of light pipe channels, wherein the plurality of light pipe columns is adapted to pass through the plurality of light pipe channels and be received by the plurality of light pipe column receptacles.

15. The light pipe assembly of claim 14, wherein the electrically conductive panel is an electromagnetic interference (EMI) shield.

16. The light pipe assembly of claim 14, wherein there is a plurality of electrically conductive panels each having a light pipe aperture, the light pipe apertures having a plurality of light pipe channels.

17. The light pipe assembly of claim 14, wherein the light pipe channels are formed at an angle in the electrically conductive panel that is not normal to the electrically conductive panel.

18. The light pipe assembly of claim 17, wherein the light pipe columns of the first light pipe are formed at the angle of the light pipe channels and the light pipe column receptacles are formed at the angle of the light pipe channels to receive the light pipe columns.

19. The light pipe assembly of claim 14, wherein the light pipe channels include an electrically conductive duct coupled to the electrically conductive panel.

\* \* \* \* \*